United States Patent [19]
McFarland

[11] Patent Number: 5,572,159
[45] Date of Patent: Nov. 5, 1996

[54] VOLTAGE-CONTROLLED DELAY ELEMENT WITH PROGRAMMABLE DELAY

[75] Inventor: Harold L. McFarland, Los Gatos, Calif.

[73] Assignee: NexGen, Inc., Milpitas, Calif.

[21] Appl. No.: 339,328

[22] Filed: Nov. 14, 1994

[51] Int. Cl.⁶ ............................. H03K 5/13; H03K 17/28
[52] U.S. Cl. ........................... 327/276; 327/281; 327/541
[58] Field of Search .............................. 327/530, 393, 327/394, 396, 270, 276, 281, 278, 101, 103, 261, 538, 541; 330/288, 310; 323/315

[56] References Cited

U.S. PATENT DOCUMENTS

| | | | |
|---|---|---|---|
| 4,797,586 | 1/1989 | Traa | 327/276 |
| 5,012,142 | 4/1991 | Sonntag | 327/281 |
| 5,144,173 | 9/1992 | Hui | 327/277 |
| 5,306,971 | 4/1994 | McCune | 327/270 |
| 5,334,891 | 8/1994 | Marbot | 327/394 |
| 5,412,336 | 5/1995 | Barrett, Jr. et al. | 327/560 |

*Primary Examiner*—Timothy P. Callahan
*Assistant Examiner*—Eunja Shin
*Attorney, Agent, or Firm*—Townsend and Townsend and Crew, LLP

[57] ABSTRACT

A voltage-controlled delay element utilizes a current-starved inverter configuration with a feedback path that ensures a rapid discharge of the storage node to ground once the desired delay time has elapsed. The circuit comprises a circuit path for charging the storage node (preferably rapidly), a first pull-down path capable of discharging the storage node at a rate determined by the control voltage, a second pull-down path capable of rapidly discharging the storage node, an output inverter, and a feedback connection between the output terminal of the output inverter and the second pull-down path to rapidly discharge the storage node when the output voltage starts rising. The circuit further comprises a means for programmably adjusting the delay in response to logic signals.

12 Claims, 6 Drawing Sheets

VOLTAGE-CONTROLLED DELAY ELEMENT WITH PROGRAMMABLE DELAY

BACKGROUND OF THE INVENTION

The present invention relates generally to delay elements and more specifically to voltage-controlled delay elements in an integrated circuit.

Many circuits require that a particular delay be introduced into a circuit path, and there exist many techniques for accomplishing this. One way is to insert an appropriate number of logic gates or inverters into the path, which is appropriate when the necessary delay is known at the time the circuit is being designed. Since this is not always the case, controllable delay elements have been developed. One such controllable delay element uses a current-starved inverter to control the timing of signal edges (transitions) at the output terminal of the delay element relative to the timing of the edges at the input terminal.

FIG. 1A is a schematic of a representative delay circuit 10 using what is known as a current-starved inverter. The illustrated circuit includes a voltage-controlled current-limiting transistor in order to delay the rising edge of an input pulse. It is also known to have a pair of voltage-controlled current-limiting transistors to delay both edges of the pulse.

The circuit includes a p-channel transistor 12 and an n-channel transistor 15 in a standard CMOS inverter configuration, with an input terminal 17 and an output terminal 18, but is modified to include a current limiting n-channel transistor 22 between transistor 15 and ground. Transistor 22 has its gate coupled to a control voltage that determines the maximum circuit that can flow through the transistor. Output terminal 18 is coupled to the input terminal 25 of an inverter 27, the output terminal 28 of which defines the output terminal of the delay element. Output terminal 18 is characterized by some capacitance, shown by a capacitor 30, drawn in phantom. This capacitance may be an actual circuit element or may be the input capacitance of the following stage (inverter 25). Output terminal 18 will be referred to as the storage node.

The operation of the circuit in response to a rising edge at input terminal 17 can be better understood if reference is made to the timing diagram of FIG. 1B. Consider an initial condition where input terminal 17 (the common gate connection for transistors 12 and 15) has been low for a relatively long time. This turns transistor 12 on and transistor 15 off, and thus allows the storage node to charge up to the supply voltage through transistor 12. Thus the storage node is high and output terminal 28 is low.

The rising edge at input terminal is shown as occurring at a time $T_{in}$, whereupon transistor 12 turns off and transistor 15 turns on, thus allowing the storage node to commence discharging. While transistor 22 remains in saturation its high drain impedance limits the rate at which this discharge can occur, however, and so the voltage on the storage node commences to fall approximately linearly at a rate that depends on the control voltage. At a later time $T_{out}$, the voltage will have fallen to a level $V_X$ that is low enough to cause inverter 27 to begin outputting a high.

However, since the storage node is discharging at a controlled rate, the output transition from inverter 27 is not sharp. Thus the rising edge at output terminal 28 is delayed by a controlled amount, but is not as well-defined as the input rising edge. Moreover, since the node may not have fully discharged by the time a later pulse occurs, the effective delay may not be stable. Rather, the resultant delay may depend on the past history of charging and discharging of the storage node.

Developing the control voltage CTL for such a delay element can introduce difficulties in very high speed computer systems. Such systems are generally characterized by a shared high-speed clock that is used for timing and control throughout the circuits of the computer. Such systems are also characterized by noise and voltage transients on the power supply. Such systems can be very sensitive to even slight timing deviations in control signals which may run through a delay element. As a result, any circuit used to develop a control voltage in such a system must be synchronized with the timing signals of the circuit and must be insensitive to transient voltage fluctuations in the power supply. Otherwise, the delay element can introduce errors in the timing control of the circuit.

SUMMARY OF THE INVENTION

The present invention provides a voltage-controlled delay element characterized by predictable and repeatable delays, regardless of past history. The output signal has a very well-defined edge. The present invention also allows for the delay period to be logically programmable and ensures that the control voltage developed by the programmable circuitry is synchronized to a system clock and immune to fluctuations in the power supply reference voltage.

In short, a delay element according to the present invention utilizes a current-starved inverter configuration with a feedback path that ensures a rapid discharge of the storage node to ground once the desired delay time has elapsed. In the context of a delay element for a rising edge input at a set signal input terminal, the circuit comprises a circuit path for charging the storage node (preferably rapidly), a first pull-down path capable of discharging the storage node at a rate determined by the control voltage, a second pull-down path capable of rapidly discharging the storage node, an output inverter, and a feedback connection between the output terminal of the output inverter and the second pull-down path to rapidly discharge the storage node when the output voltage starts rising. The rapid discharge of the storage node accelerates the rise of the output signal, thereby shortening the rise time of the output edge.

The delay period is logically programmable through use of a series current-mirror circuits which are used to develop a control voltage for the delay element. A base-mirror circuit develops a control voltage in response to reference signals that are based on and synchronized to the system clock. This base-mirror circuit is connected to a series of gate-mirror circuits, each of which can be switched on or off in response to a logic signal. The gate-mirror circuits draw current from the path in the base-mirror that produces the control voltage and cause the voltage to decrease in predictable steps. These steps cause changes in the delay of the delay element which are percentages of the system clock.

A number of signal paths in the base-mirror and gate-mirrors are constructed of cascode current-mirrors. A cascode current mirror is constructed of two transistors in series forming a cascode current source (the source path) and two diode-connected transistors in series (the reference path). The gates of the source transistors are connected to the diode-connected gates of the reference path. A reference current driven through the reference path determines two reference voltages that gate the transistors of the source path and thus determine a source current. This source current is independent of the load driven by the source path. In the cascode current source, the source path transistor farthest from the load determines the current flowing through the source path and the transistor nearest the load passes this current to the load while allowing the load transistor to maintain a nearly constant drain-to-source voltage even when the load varies. A constant drain-to-source voltage on the source transistor is important because the current flowing through the source transistor, while determined primarily by the gate-source voltage, will vary slightly with variations in the drain-to-source voltage. Current-mirrors in the invention are provided with compensating capacitors to prevent unintended fluctuations in the reference path voltage from causing noise in the source current signal. (See related application Ser. No. 08/342,086 for a description of this unique current-mirror design.)

In a specific embodiment, the charging path of the delay element includes two transistors, one that is controlled by set signal IN, the other that is controlled by a reset signal. The first pull-down path includes two transistors, one that is controlled by the set signal IN, the other that is controlled by the control voltage. The second pull-down path includes two transistors, one that is controlled by the reset signal, the other that is controlled by a feedback signal from the output inverter. The transistor gated by the control voltage is essentially the source half of a current mirror the reference half of which is a part of the base mirror.

The inputs to the base-mirror are input to the source half of a current mirror. The outputs from the base-mirror are developed by the reference half of a second current mirror. The base mirror is connected to two or three gate-mirrors, each of which is the source half of a current-mirror with a switching transistor to allow for logic programmability.

A further understanding of the nature and advantages of the present invention may be realized by reference to the remaining portions of the specification and the drawings.

DESCRIPTION OF SPECIFIC EMBODIMENTS

Circuit Overview

Figure 2:
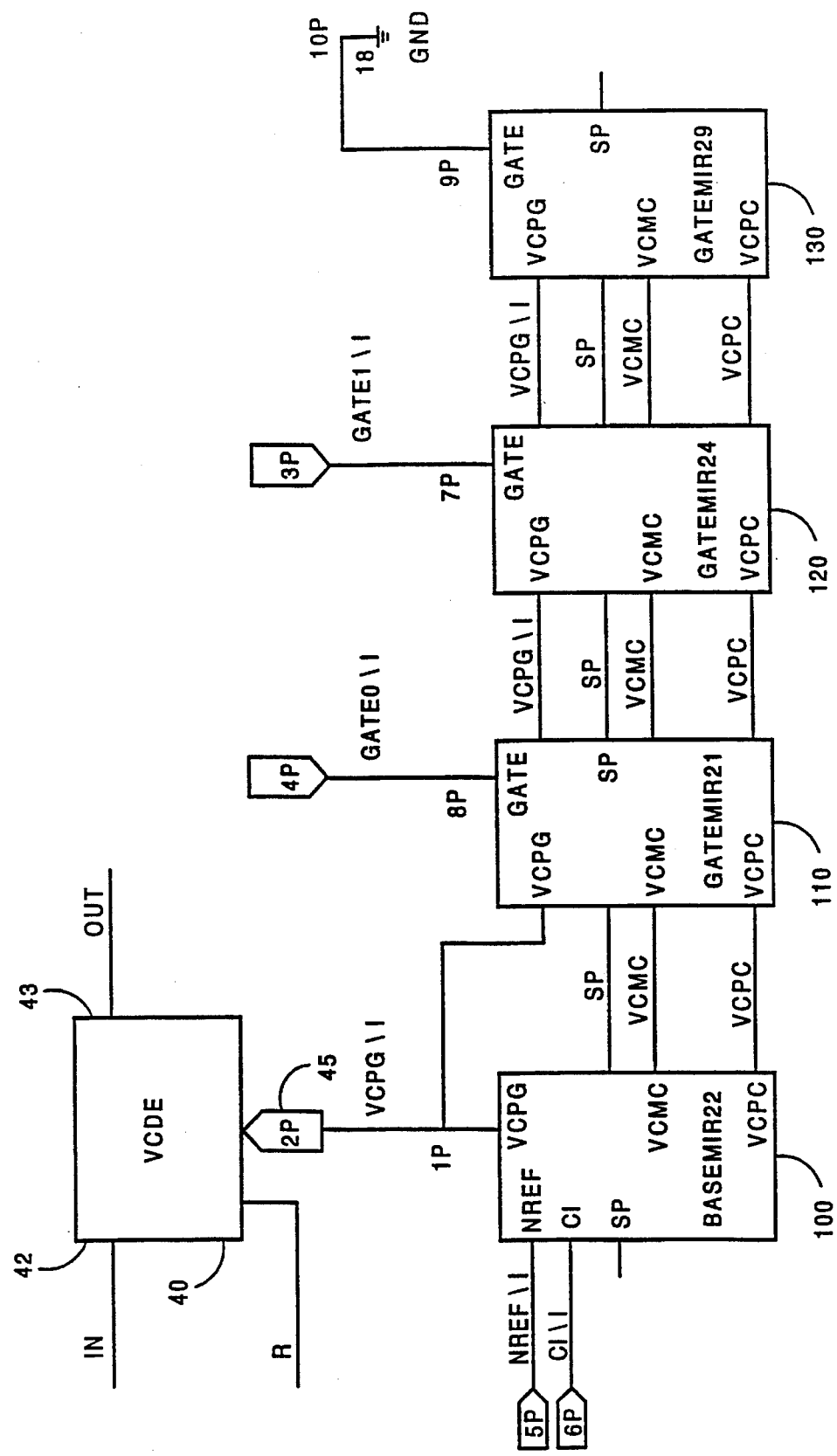
FIG. 2 is a block diagram of a programmable delay circuit according to the present invention.

FIG. 2 is a block diagram of a specific embodiment of a programmable delay circuit according to the present invention. The circuit contains a voltage controlled delay element (VCDE) 40, a base-mirror circuit 100, and gate-mirror circuits 110, 120, and 130. Delay element 40 accepts a signal having a rising edge at an input terminal 42 and provides an output signal having a delayed rising edge at an output terminal 43. The delay T, depends on a current $I_{CTL}$ flowing through a control transistor in the VCDE and being approximately of the form:

$$T=T_0+(Q_0/I_{CTL}) \quad (1)$$

where $T_0$ and $Q_0$ are constants. The control transistor is gated by control voltage VCPG developed in base-mirror 100.

In one type of computer system for which the invention is designed, it is desired to have a delay period T that is precisely programmable to be one of several known fractions of a reference period. This functionality is accomplished by having control current $I_{CTL}$ programmably determined by base-mirror 100 and gate-mirrors 110, 120, and 130, which are made up of a number of current-mirror circuits. Control voltage VCPG is the gate signal for the source half of a current mirror within the VCDE which determines $I_{CTL}$. VCPG is produced within base-mirror 100 by driving a diode-connected transistor with a current signal $I_X$. This current signal $I_X$ can be altered by switching on or off gate-mirror circuits 110 and 120. When either of these gate-mirror circuits is turned on in response to one of the digital signals GATE0 or GATE1, a precise amount of current is drained from base-mirror 100 on signal line SP. This SP current is diverted from current $I_X$ flowing through the aforementioned diode-connected transistor in base-mirror 100, and $I_X$ and VCPG are thereby programmably reduced.

In this particular configuration of the invention, the gate-mirrors are fabricated such that gate-mirror 120 draws precisely four times the current when it is on as does gate-mirror 110, and gate-mirror 130 draws precisely nine times the current as does gate-mirror 110. In the circuit of FIG. 2, gate-mirror 130 is always on as its gate signal is connected to ground. These values are selected to determine a particular range of programmable delay intervals desired in a particular operating environment for the invention. Any other values for the relative amount of current drained by the gate-mirrors are possible.

With the configuration illustrated in FIG. 2, current $I_X$ can be represented by the equation:

$$I_X=[K_2/(1+K_5(1a+4b+9c))]*I_{PWINT} \quad (2)$$

$I_{PWINT}$ is a current that is externally generated. $I_{PWINT}$ determines voltage signals NREF and CI, which are inputs to base-mirror 100, and these signals determine VCMC and VCPC. NREF, CI, VCMC and VCPC act to calibrate the other signals in the base-mirror and gate-mirror circuits with the external system clock so that the programmable delays through VCDE 40 are precise percentages of a desired base delay. In the above equation $K_2$ and $K_5$ are constants determined by the size of the transistors within the base-mirror and gate-mirror circuits; a and b are either 0 or 1 depending whether their respective gate-mirrors are on or off; and c is 1 because its gate-mirror control signal is grounded and it is therefore always on. VCPG can therefore be programmably set to four different values depending on the logic states of GATE0 and GATE1.

Control current $I_{CTL}$ mirrors the $I_X$ current through a current-mirror configuration gated by voltage VCPG. $I_{CTL}$ is equal to current $I_X$ times a constant that depends on the relative size of the transistors. $I_{PWINT}$ is adjusted to select the desired control range $T_{MAX}$ for the voltage controlled delay element by setting $I_{PWINT}$ to the value:

$$I_{PWINT}=[I_X/I_{CTL}]*[Q_0/(K_2*T_{MAX})] \quad (3)$$

in the Eq. 2 above, where $Q_0$ is the constant from Eq. 1 and $T_{MAX}$ is the desired control range:

$$I_{CTL}=[Q_0/T_{MAX}]/[1+K_5(1a+4b+9c)] \quad (4)$$

and the ratio $I_X/I_{CTL}$ is approximately equal to the ratio of the transistor size of the diode-connected output transistor 135 in base-mirror 100 to the size of the current-limiting transistor in delay element 40. Combining Eq. 1 and Eq. 4, the delay is:

$$T=T_0+T_{MAX}[1+K_5(1a+4b+9c)] \quad (5)$$

As this equation shows, T can be incremented by setting a or b to zero or 1 in steps that are a fraction of the control range.

Voltage-Controlled Delay Element

Figure 3A:
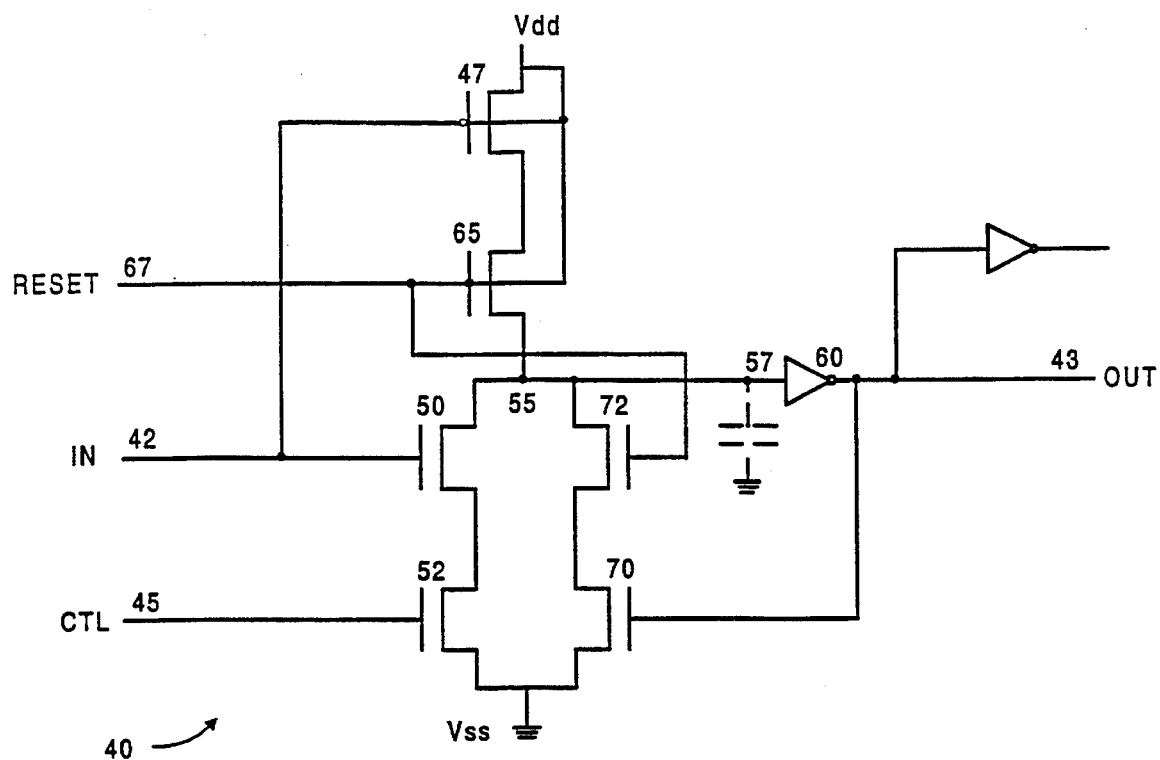
FIG. 3A is a schematic of a delay element using a current-starved inverter with feedback according to the present invention.

FIG. 3A is a schematic of a delay circuit 40 according to the present invention. The circuit is a variant of the current-starved inverter shown in FIG. 1A.

Figure 1A:
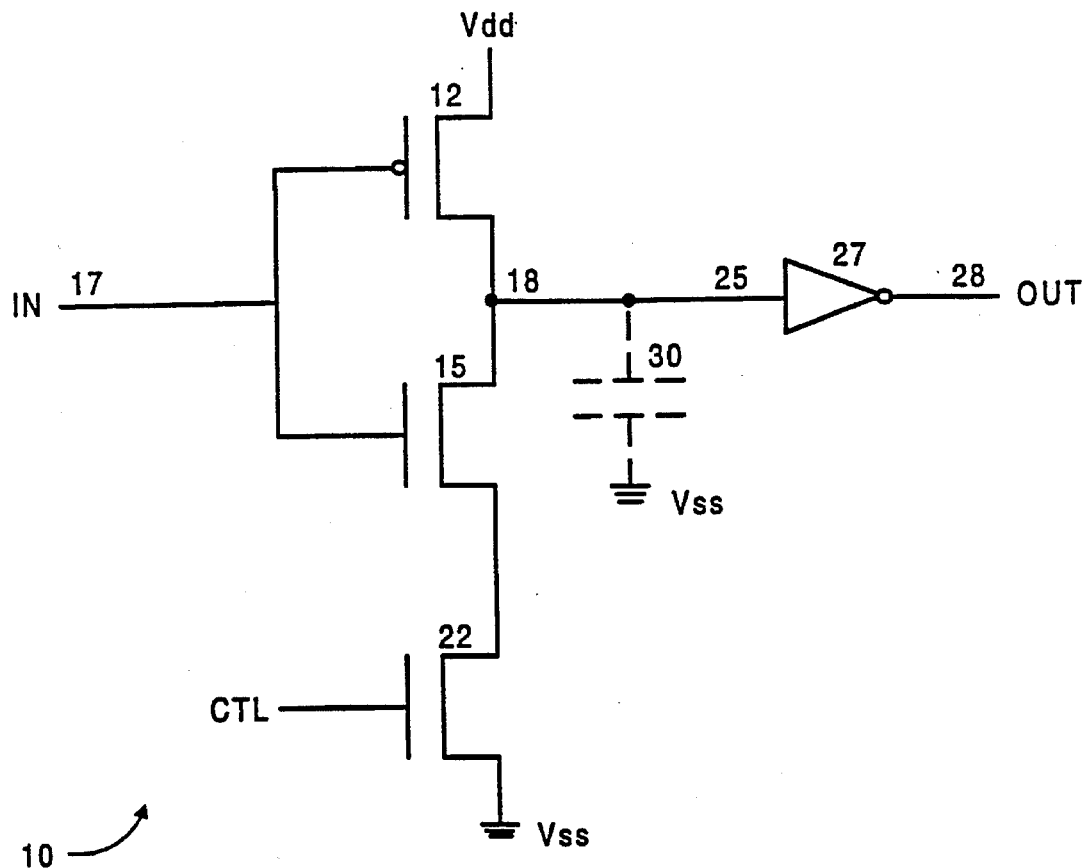
FIG. 1A is a schematic of a delay element using a current-starved inverter.
Figure 1B:
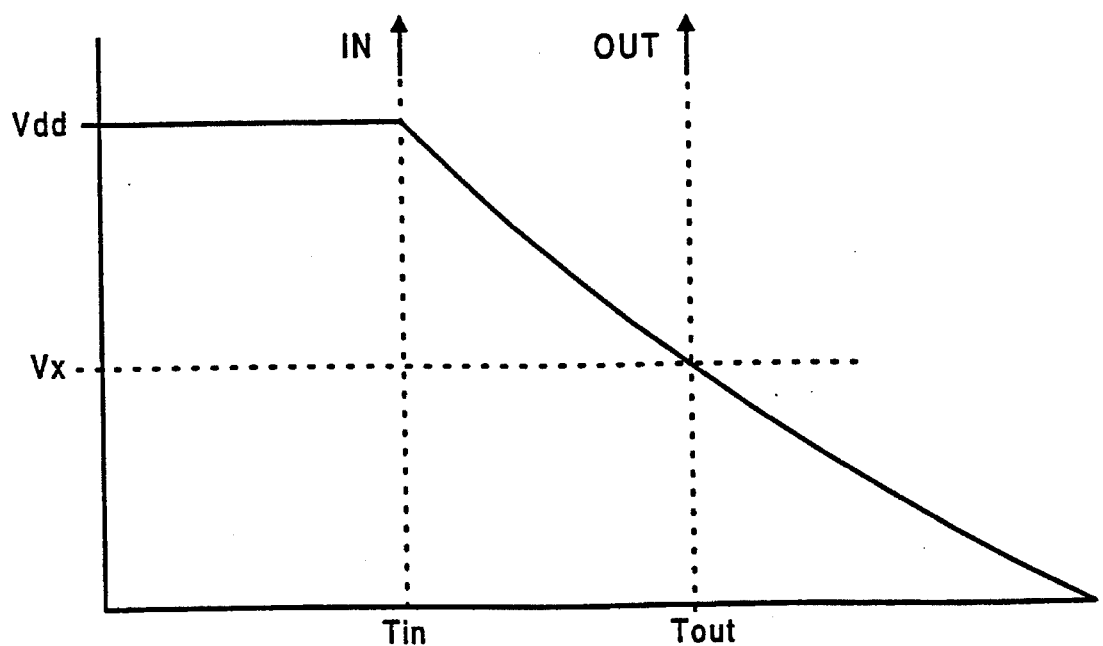
FIG. 1B is a timing diagram for the delay element of FIG. 1A.

A number of elements correspond to elements in the FIG. 1A circuit including a p-channel transistor 47 and an n-channel transistor 50 in a modified inverter configuration, a voltage-controlled current-limiting n-channel transistor 52 in the path between transistor 50 and ground, a storage node 55 coupled to the input terminal 57 of an inverter 60, the output terminal of which defines output terminal 43. The charging of the storage node is qualified by an additional p-channel transistor 65 connected in series with transistor 47 in the path between the storage node and the positive supply. The gate of transistor 65 is connected to a reset input terminal 67.

The circuit further includes a separate pull-down path between storage node 55 and ground, utilizing feedback to cause very rapid discharge of the storage node once the transition at output terminal 43 has occurred. The rapid discharge is effected by an n-channel transistor 70 having its gate coupled to output terminal 43. The rapid discharge of the storage node is qualified by an n-channel transistor 72 in series with transistor 70 in the pull-down path. The gate of transistor 72 is also connected to reset input terminal 67.

Figure 3B:
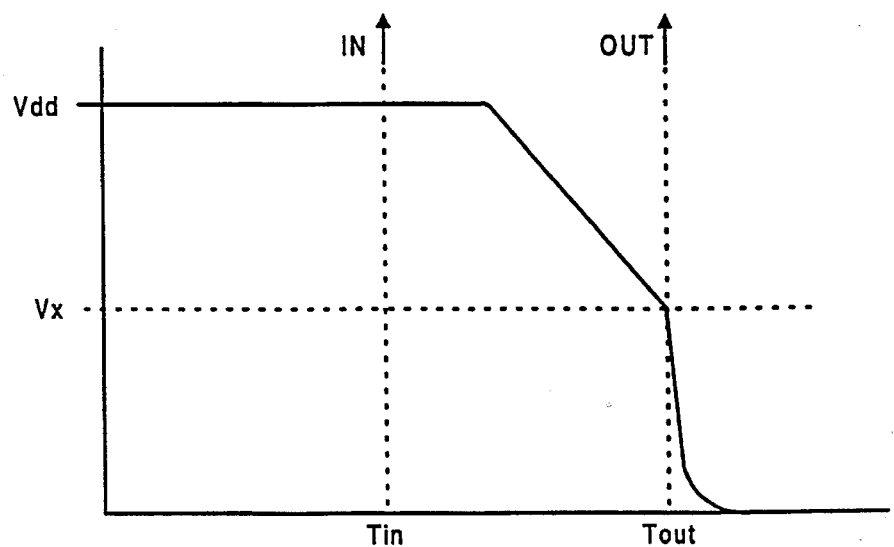
FIG. 3B is a timing diagram for the delay element of the present invention.

The operation of the circuit in response to a rising edge at set terminal 42 can be better understood if reference is made to the timing diagram of FIG. 3B. Consider an initial condition where set terminal 42 is low and reset terminal 67 is brought low. This turns transistors 47 and 65 on and transistors 50 and 72 off, and thus allows the storage node to charge up rapidly to the supply voltage through transistors 65 and 47. Thus the storage node is high and output terminal 43 is low. Reset terminal 67 is now brought high, which disconnects the storage node from the supply voltage.

The rising edge at set terminal 42 occurs at a time $T_{in}$, whereupon transistor 50 turns on, thus allowing the storage node to commence discharging. Transistor 52 limits the rate at which this discharge can occur, however, and so the voltage on the storage node commences to fall linearly at a rate that depends on the control voltage. At a later time $T_{out}$, the voltage will have fallen to a level $V_X$ that is low enough to make inverter 60 output a high. Thus the rising edge at output terminal 43 is delayed by a controlled amount. The delay T, depends on the current, $I_{CTL}$, through transistor 52, being approximately of the form $T=T_0+(Q_0/I_{CTL})$ where $T_0$ and $Q_0$ are constants.

When inverter 60 outputs a high, this turns transistor 70 on and causes a rapid discharge of the storage node through transistors 70 and 72 which are both on (reset terminal 67 was already high). This rapid discharge to ground enhances the rising edge on output terminal 43, and makes further operation predictable and repeatable.

Although it was assumed above that reset terminal 67 was brought high before the rising edge on set terminal 42, the actual requirement is only that the reset terminal is brought high before the output terminal 43 goes high (this is required so that transistor 72 will conduct as soon as transistor 70 conducts).

Base-Mirror Circuit

Figure 4:
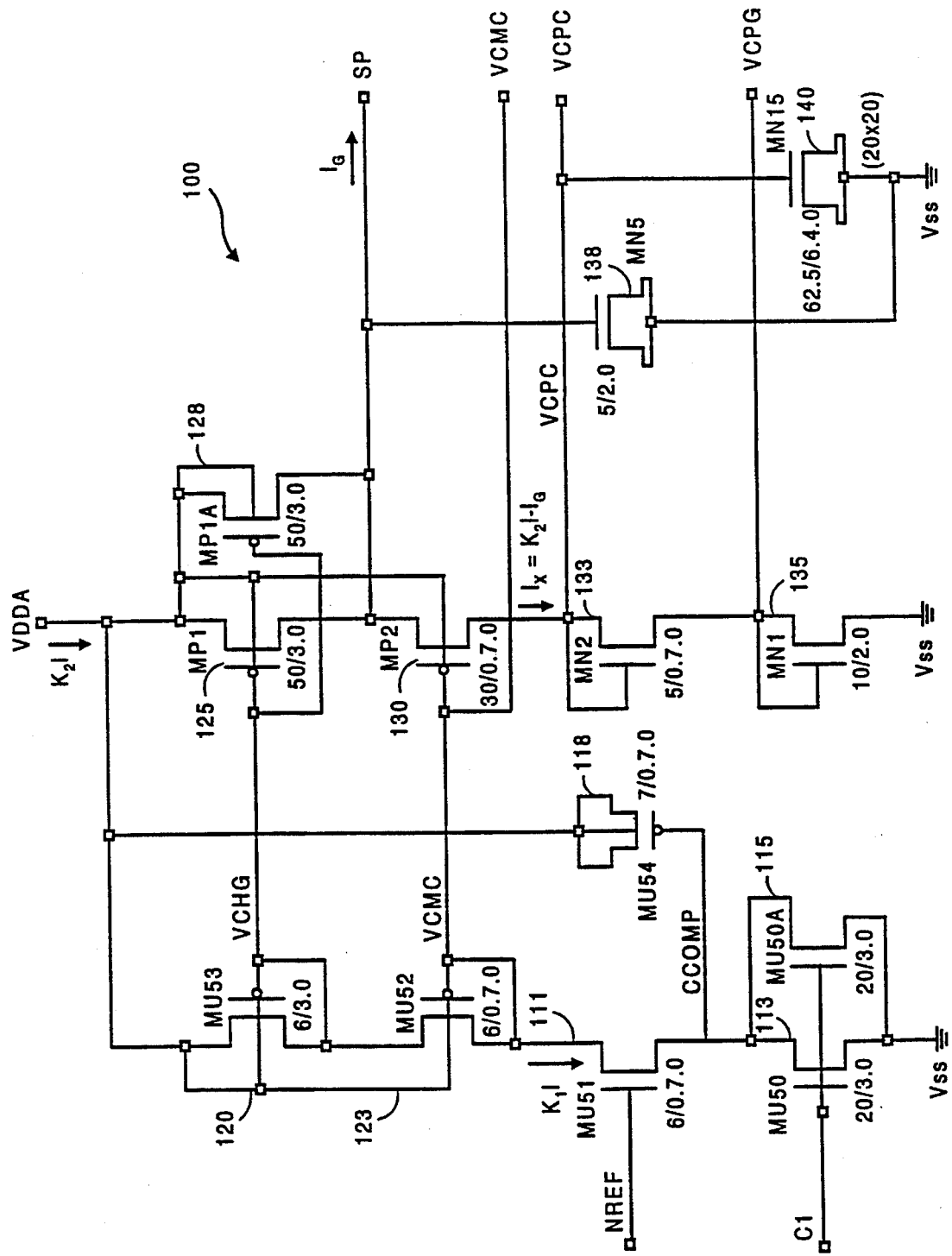
FIG. 4 is a schematic of a base-mirror circuit using current-mirrors according to the present invention.

FIG. 4 is a schematic diagram of base-mirror 100. The base-mirror 100 determines the voltage VCPG, which is used as the control voltage of delay element 40. As noted above, this control voltage may be adjusted in steps by logically switching on or off a number of gate-mirrors which are connected to the base-mirror by lines on which are communicated signals VCHC, VCPC, VCPG, and SP.

The voltage VCPG is determined and made adjustable as follows. Transistors 111, 113, 115, and 118 make up the source half of a current mirror, with reference signals input at inputs NREF and C1. In one application for the invention, the reference signals NREF and C1 are determined by the gate and drain connections of two transistors in series which conduct a calibrating current to determine the delay control range of the VCDE 40 as given by Eq. 3 above. The inputs NREF and CI determine a drain/source current $K_1I$ flowing through transistors 111 and 113/115. Transistor 118 acts as a compensating capacitor for the current mirror and is only important when voltage transients in $V_{dd}$ cause voltage transients on NREF and C1.

The current $K_1I$ determined by NREF and C1 is drawn through transistors 120 and 123 which are diode-connected p-channel transistors. Transistors 120 and 123 are the reference half of a current mirror with the source half being transistors 125, 128 and 130. Current $K_1I$ determines a gate/source voltage VCHG across transistor 120 and a gate/source voltage VCMC across transistor 123. VCHG is used to gate transistors 125 and 128, which together determine a current $K_2I$.

The current flowing through transistors 130, 133, and 135 is the current $K_2I$ minus any current $I_G$ that is drained off by the gate-mirrors through signal line SP. This current, $I_X$, flows across diode-connected transistor 133 and determines a gate/source voltage VCPC which is used a reference voltage in the gate-mirror. $I_X$ also flows across diode-connected transistor 135 and determines a gate/source voltage VCPG, the control voltage for delay element 40. In this way the control voltage VCPG is alterable by switching on or off gate-mirrors 110, 120, and 130.

Gate-Mirror Circuit

Figure 5:
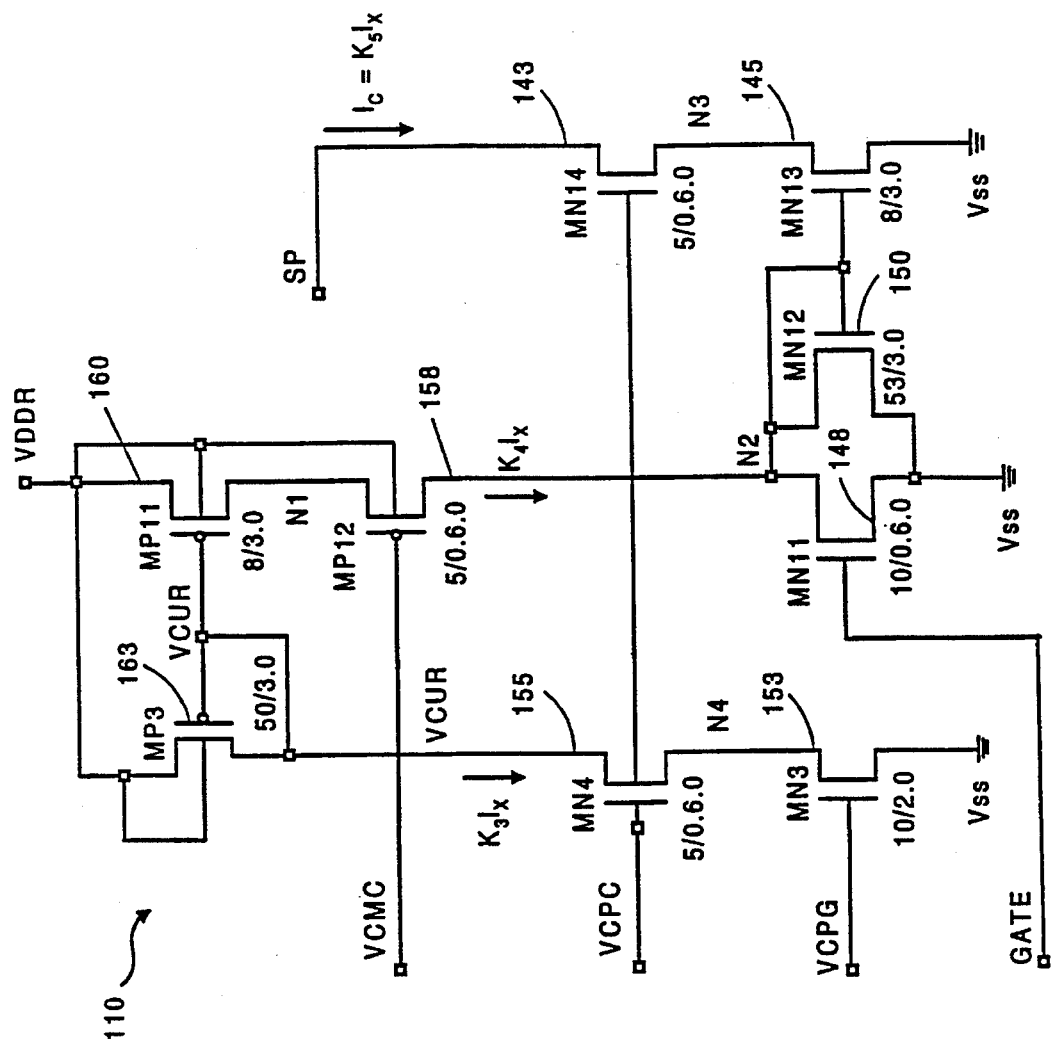
FIG. 5 is a schematic of a gate-mirror circuit using one-half a current-mirror according to the present invention.

FIG. 5 is a schematic diagram of gate-mirror 110. Gate-mirror 110 is used along with gate-mirrors 120 and 130 to logically program the control voltage VCPG by either drawing no current on line SP or by draining a precisely controlled amount of current to achieve a desired control voltage VCPG and a desired delay as follows.

The signal GATE determines whether any current is drawn by the gate-mirror. The signal GATE is a logic signal and may be provided by a standard logic register.

If the signal on GATE is above ground (a binary "1"), then transistor 148 will be turned on and the gate of transistor 145 will be connected to ground and transistor 145 will be turned off. Therefore no current will flow through transistor 145 and the contribution of gate-mirror 110 to current $I_G$ will be zero. In this state there is no effect on control voltage VCPG due to the gate-mirror 110.

If the signal on GATE is ground (a binary "0"), then transistor 148 is turned off, and a current $K_5I_X$ is determined by the action of transistors 143 and 145, which are the source half of a current mirror. The gate voltage on transistor 145 is set by the base-mirror signals VCMC, VCPC, and VCPG as follows. Signals VCPG and VCPC are gate voltages for transistors 153 and 155, which are the source half for a current mirror whose reference half is transistors 133 and 135 in base-mirror 100. This source determines a current $K_3I_X$ which is proportional to $I_X$. This current is drawn through diode-connected transistors 163 which determines a current VCUR. VCUR and VCMC gate cascade current source transistors 158 and 160, which determine a current $K_4I_X$. When transistor 148 is off, this current flows through diode connected transistor 150, generating a gate voltage for current source 145 that sets the amount of current $K_5I_X$ that flows when GATE is high.

Figure 6:
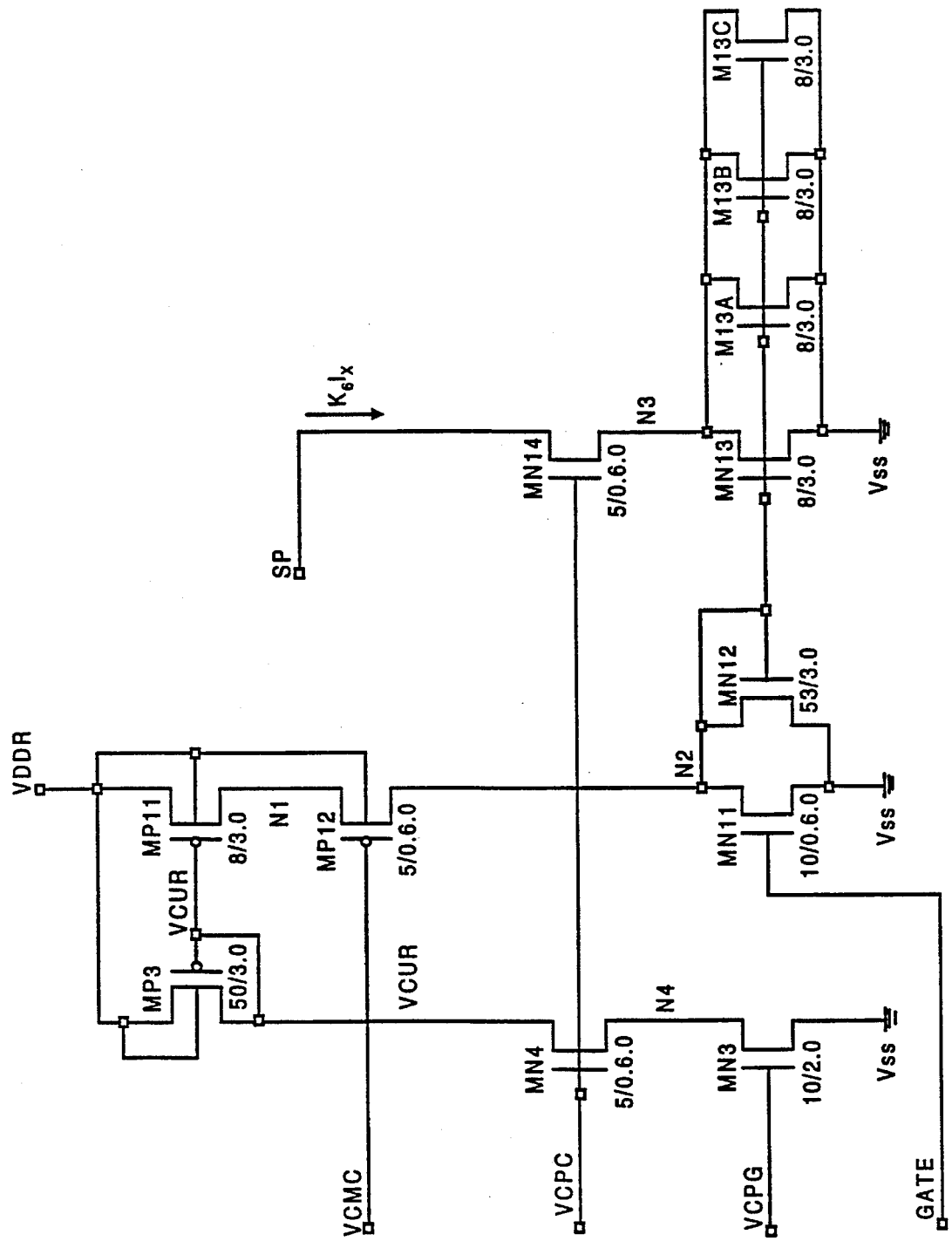
FIG. 6 is a schematic of a gate-mirror circuit using one-half a current-mirror according to the present invention, with multiple current source transistors.

FIG. 6 is a schematic of gate-mirror 120. Gate-mirror 120 is identical to gate-mirror 110 with the one exception that transistor 145 in gate-mirror 110 is replaced by a bank of four transistors each of which is identical in size to 145. With this change, a current $K_6I_X$ is drained from signal line SP when gate-mirror 120 is turned on, and this current is precisely four times greater than the current $K_5I_X$ drawn by gate-mirror 110 when it is turned on. By adjusting the number of transistors in the transistor bank, gate-mirrors that drain with any multiple of current $K_5I_X$ from signal line SP can be constructed to provide different amounts of programming control.

In FIG. 2, gate-mirror 130, which is not shown schematically, is identical to 120 except there are 9 transistors each identical to 145, determining current $K_7I_X$ which is 9 times as great as $K_5I_X$ from 110.

Conclusion

In conclusion it can be seen that the present invention provides a highly stable and effective delay element. The use of the feedback path for rapidly discharging the storage node to ground provides a sharply rising edge at the output terminal and allows operation that does not depend on the history of the input signals. The use of a base-mirror and gate-mirror calibrated to a system clock allows the control voltage of the delay to be programmed linearly in steps that are precise percentages of a base delay value.

While the above is a complete description of specific embodiments of the invention, various modifications, alternative constructions, and equivalents may be used. For example, the description above is in terms of a circuit that operates to delay a rising edge. The circuit could be modified to delay falling edges by having a single rapid pull-down path, and voltage-controlled and feedback-controlled pull-up paths. Alternatively, an inverter could be placed at the input so that the falling edge would be converted to a rising edge, which would be delayed. The delayed edge, now a rising edge, could be converted back to a falling edge with an additional inverter at the output.

Therefore, the above description should not be taken as limiting the scope of the invention as defined by the claims.

What is claimed is:

1. A programmable delay element comprising:
    a voltage controlled delay element having a delay period proportional to an analog control voltage;
    control voltage determining means connected to said voltages controlled delay element for determining said analog control voltage; and
    a plurality of programmable control voltage adjusting means connected to said control voltage determining means for modifying said analog control voltage in response to logic signals, wherein said control voltage determining means comprises:
    a source path that sets a base current;
    a control voltage generating path connected to said source path that determines said analog control voltage by running a source current that is proportional to said base current over a transistor; and
    a gate path connected to said control voltage generating path for draining source current from said control voltage generating path and thereby adjusting said control voltage.

2. A programmable delay element comprising:
    a voltage controlled delay element (VCDE);
    control voltage determining means connected to said VCDE for determining a control voltage; and
    a plurality of programmable control voltage adjusting means for modifying said control voltage in response to logic signals;
    wherein said control voltage determining means comprises:
        a first source path that sets a base current;
        a control voltage generating path connected to said first source path for determining said control voltage by running a source current that is proportional to said base current over a transistor;
        a gate path connected to said control voltage generating path for draining source current from said control voltage generating path and thereby adjusting said control voltage;
    wherein each of said programmable control voltage adjusting means comprises:
        an additional source path for receiving input signals from the control voltage determining means to set a second base current;
        a switching path coupled between said additional source path and a current sinking means for switching the programmable control voltage adjusting means on or off in response to one of said logic signals by connecting or not connecting said additional source path to said current sinking means; and
        wherein said current sinking means connected to said gate path drains a specified amount of current from said control voltage generating means when connected to said additional source path.

3. The programmable delay element according to claim 1 wherein each of said programmable control voltage adjusting means comprises:
    a source path for receiving input signals from the control voltage determining means and for setting a base current;

a switching path coupled to said programmable control voltage source path for switching the programmable control voltage adjusting means on or off in response to one of said logic signals; and current sinking means connected to said gate path for draining a specified amount of current from said control voltage generating means when said programmable control voltage adjusting means is turned on.

4. A programmable delay element comprising:

a circuit capable of producing an output signal that follows an input signal with a delay that is proportional to a control signal applied at a control signal input;

a control signal determining circuit with an output operably connected to said control signal input and a load input; and a plurality of programmable control signal adjusting circuits operably connected to said load input for modifying said control signal in response to logic signals wherein said control signal determining circuit comprises:

a source path that sets a base current;

a control signal generating path connected to said source path that determines said control signal by running a source current that is proportional to said base current over a transistor; and a gate path connected to said control signal generating path for draining source current from said control signal generating path and thereby adjusting said control signal.

5. The programmable delay element according to claim 4 wherein each of said programmable control signal adjusting circuits comprises:

a source path for receiving input signals from the control signal determining circuit to set a base current;

a switching path to switch the programmable control signal adjusting means on or off in response to one of said logic signals; and a current sink connected to said gate path that drains a specified amount of current from said control signal determining circuit when said programmable control signal adjusting means is turned on.

6. A programmable delay element comprising:

a circuit capable of producing an output signal that follows an input signal with a delay that is a function of a control signal applied at a control input;

a base-mirror circuit with an output operably connected to said control input and a gate input; and a plurality of gate-mirror circuits operably connected to said base-mirror circuit via said gate input;

wherein said base-mirror circuit comprises:

a first source half of a first current-mirror circuit, said first source half having external reference signal inputs;

a second current-mirror circuit comprising a second reference half operably connected to said first source half and a second source half;

a third reference half of a third current-mirror circuit operably connected to said second source half, said third reference half connectable to a third source half in a gate-mirror circuit; and a gate path connected to said second source half for draining source current from said second source half.

7. The programmable delay element according to claim 6 wherein at least one of said gate-mirror circuits comprises:

said third source half of said third current-mirror circuit, said third source half connected to said third reference half, said third source half connected to the gate path for draining a specified amount of current from said second source half when said gate mirror is turned on; and a switch transistor to switch said gate mirror on or off in response to a logic signal.

8. The programmable delay element according to claim 6 wherein each of said plurality of gate-mirror circuits comprises:

said third source half of said third current-mirror circuit, said third source half connectable to said third reference half, said third source half connected to the gate path for draining a specified amount of current from said second source half when said gate mirror is turned on, said specified amount of current depending on a number of transistors in parallel in said third source half wherein at least one of said gate-mirror circuits has a third source half with a different number of transistors in parallel than another of said gate-mirror circuits; and a switch transistor to switch said third source half on or off in response to a logic signal.

9. The programmable delay element according to claim 8 wherein said base-mirror circuit generates a current signal $I_X$ used to determine the delay of said delay element, said current signal $I_X$ represented by the equation:

$$I_X=[K_2/(1+K_5(Na+Mb+Lc))]*I_{PWINT}$$

where $I_{PWINT}$ is a current that is externally generated, $K_2$ and $K_5$ are constants determined by the size of the transistors within said base-mirror and said gate-mirror circuits, a, b and c are either 0 or 1 depending whether their respective gate-mirrors are on or off, and L, M, and N are constants representing the number of transistors in parallel in each gate mirror.

10. The programmable delay element according to claim 8 wherein said base-mirror circuit generates a current signal $I_X$ used to modify the delay of said delay element, said current signal $I_X$ represented by the equation:

$$I_X=[K_2/(1+ K_5*\epsilon N_n a_n)]*I_{PWINT}$$

where $I_{PWINT}$ is a current that is externally generated, $K_2$ and $K_5$ are constants determined by the size of the transistors within said base-mirror and said gate-mirror circuits, and the expression $\epsilon N_n a_n$ represents the sum of the current drained by each gate-mirror circuit n, having a number of transistors in parallel $N_n$ and multiplied by its respective binary on/off value $a_n$.

11. The programmable delay element according to claim 6 wherein said delay (T) is represented by the equation $$T=T_0+T_{MAX}[1+K\epsilon N_n a_n],$$

where K is a constant determined by the size of the transistors within said base-mirror, $T_0$ and $T_{MAX}$ are constants, and the expression $\epsilon N_n a_n$ represents the sum of the current drained by each gate-mirror circuit n, having a number of transistors in parallel $N_n$ and multiplied by its respective binary on/off value $a_n$.

12. The programmable delay element according to claim 6 wherein said delay (T) is represented by the equation $$T=T_0+Q_0/I_{CTL}$$

where $T_0$ and $Q_0$ are constants and $I_{CTL}$ is the value of a current signal determined by said control signal.

* * * * *